(12) United States Patent
Sharma

(10) Patent No.: US 7,924,093 B2
(45) Date of Patent: Apr. 12, 2011

(54) AMPLIFIER ARRANGEMENT AND METHOD FOR SIGNAL AMPLIFICATION

(75) Inventor: Vivek Sharma, Olten (CH)

(73) Assignee: austriamicrosystems AG, Unterpremstätten (AT)

( * ) Notice: Subject to any disclaimer, the term of this patent is extended or adjusted under 35 U.S.C. 154(b) by 39 days.

(21) Appl. No.: 12/419,756

(22) Filed: Apr. 7, 2009

(65) Prior Publication Data

US 2009/0256636 A1 Oct. 15, 2009

(30) Foreign Application Priority Data

Apr. 10, 2008 (EP) .................................. 08007154

(51) Int. Cl.
*H03F 3/45* (2006.01)
(52) U.S. Cl. ............ 330/255; 330/51; 330/254; 330/261
(58) Field of Classification Search .................. 330/253, 330/254, 255, 261–264, 267, 269
See application file for complete search history.

(56) References Cited

U.S. PATENT DOCUMENTS

| 6,177,838 B1 * | 1/2001 | Chiu ............................. 330/253 |
| 6,307,430 B1 | 10/2001 | Thomsen et al. |
| 7,170,338 B1 | 1/2007 | Tucker |
| 7,741,910 B2 * | 6/2010 | Wong ............................. 330/260 |

OTHER PUBLICATIONS

K. Bult et al., "A Fast-Settling CMOS Op Amp for SC Circuits with 90-dB DC Gain", IEEE Journal of Solid-State Circuits, vol. 25, No. 6, pp. 1379-1384, Dec. 1990.
L. Callewaert et al., "Class AB CMOS Amplifiers with High Efficiency", IEEE Journal of Solid-State Circuits, vol. 25, No. 3, pp. 684-691, Jun. 1990.
R. Castello et al., "A High-Performance Micropower Switched-Capacitor Filter", IEEE Journal of Solid-State Circuits, vol. SC-20, No. 6, pp. 1122-1132, Dec. 1985.
M. Helfenstein, et al., "90dB, 90MHz, 30mW OTA with the Gain-Enhancement Implemented by One- and Two-Stage Amplifiers", 1995 IEEE International Symposium on Circuits and Systems (ISCAS), pp. 1732-1735, XP000559036, Apr. 30, 1995.
A.J. Lopez-Martin et al., "Low-Voltage Super Class AB CMOS OTA Cells With Very High Slew Rate and Power Efficiency", IEEE Journal of Solid-State Circuits, vol. 40, No. 5, pp. 1068-1077, May 2005.
D. Miyazaki et al, "A 10-b 30-MS/s Low-Power Pipelined CMOS A/D Converter Using a Pseudodifferential Architecture", IEEE Journal of Solid-State Circuits, vol. 38, No. 2, pp. 369-373, Feb. 2003.

* cited by examiner

*Primary Examiner* — Khanh V Nguyen
(74) *Attorney, Agent, or Firm* — Cohen Pontani Lieberman & Pavane LLP

(57) ABSTRACT

An amplifier arrangement comprises a signal input (Iin+, Iin−) to receive a signal to be amplified, a signal output (Out) to provide an amplified signal, an amplifier stage (AS) coupled between the signal input (Iin+, Iin−) and the signal output (Out), a switchable dynamic biasing stage (DB) with an input coupled to the signal input (Iin+, Iin−), a switchable gain boosting stage (GB) with an input coupled to the signal input (Iin+, Iin−), and a switching device (SD) coupled to the amplifier stage (AS) such that either an output of the switchable dynamic biasing stage (DB) or an output of the switchable gain boosting stage (GB) are coupled to the amplifier stage (AS). In one embodiment, by enabling the switchable dynamic biasing stage (DB) in an initial large-signal phase of amplification and the switchable gain boosting stage (GB) in a latter small-signal phase of amplification by means of the switching device (SD), high gain and low current consumption are simultaneously realised. Furthermore, a method for signal amplification is disclosed.

11 Claims, 2 Drawing Sheets

AMPLIFIER ARRANGEMENT AND METHOD FOR SIGNAL AMPLIFICATION

RELATED APPLICATION

This application claims the priority of European application no. 08007154.1 filed Apr. 10, 2008, the entire content of which is hereby incorporated by reference.

FIELD OF THE INVENTION

The invention relates to an amplifier arrangement and to a method for signal amplification.

BACKGROUND OF THE INVENTION

There are several applications where signals have to be amplified, for example in switched or clocked circuits like analogue digital converters or switched capacitor filters. In many cases, an amplifier providing high gain and at the same time consuming low current is needed, especially for driving on-chip capacitive loads.

Gain boosting is a method widely used to achieve high gain. This technique relies on the use of an auxiliary amplifier which works in parallel to a main signal path comprising a main amplifier. The auxiliary amplifier boosts the effective output impedance and thereby the gain of the main amplifier. In one existing implementation, the main amplifier can comprise a field effect transistor. The auxiliary amplifier can comprise an operational transconductance amplifier with high output impedance. An input of the auxiliary amplifier is coupled to a source terminal of the main amplifier. An output of the auxiliary amplifier is coupled to the gate terminal of the main amplifier. A signal to be amplified is supplied to the gate terminal of the main amplifier. The auxiliary amplifier regulates its output to exactly the same voltage regardless of the input signal seen by the main amplifier. This process of regulation can go on for the entire time available for completion of settling. The output impedance of the main amplifier is thereby enhanced. An amplified signal is provided at the drain terminal of the main amplifier.

The principle of gain boosting is described in detail in K. Bult and G. J. G. M. Geelen, "A fast-settling CMOS op amp for SC circuits with 90-dB DC gain," IEEE J. Solid-State Circuits, vol. 25, pp. 1379-1384, December 1990.

One possibility to realize low current consumption in amplifiers is by using dynamic biasing. Dynamic biasing techniques rely on changing a bias current flowing through an output branch of an amplifier with respect to the strength of an input signal. This reduces the current consumption when there is less signal activity and increases the current consumption in case of high signal activity. In one existing implementation, a biasing control unit is coupled to the control input terminal of the main amplifier. The signal to be amplified is also fed to an input of the biasing control unit. The biasing control unit generates a control signal proportional to the input signal seen by the main amplifier. The output of the biasing control unit is therefore always optimized for the instantaneous input signal seen by the main amplifier. In order to accomplish its task well, the biasing control unit has to react immediately to instantaneous changes of the signal applied to the main amplifier and track these variations. Therefore, the output of the biasing control unit should have low impedance.

A detailed description of dynamic biasing can be found in R. Castello and P. R. Gray, "A High-Performance Micropower Switched-Capacitor Filter," IEEE J. Solid-State Circuits, vol. SC-20, no. 6, pp. 1122-1132, December 1985.

The schemes of gain boosting and dynamic biasing are inherently in conflict as both methods operate directly on the output branch of the main amplifier. To achieve high gain and low current consumption, a composite amplifier could be built by cascading a conventional gain boosted amplifier with a dynamically biased amplifier. However, this leads to two or more gain stages, one of which is dynamically biased. This complicates the compensation of the overall amplifier, often requiring performance to be sacrificed. What is more, current consumption is optimized only for the stage which is dynamically biased, whereas the gain boosted stage still operates while constantly consuming maximum power. More stages also imply larger quiescent power consumption.

SUMMARY OF THE INVENTION

It is an object of the invention to provide an amplifier arrangement and a method for signal amplification which are able to achieve power efficient and high gain amplification in a single amplification stage.

This and other objects are attained in accordance with one aspect of the invention directed to an amplifier arrangement comprises a signal input to receive a signal to be amplified, a signal output to provide an amplified signal, an amplifier stage, a switchable dynamic biasing stage, a switchable gain boosting stage, and a switching device. The amplifier stage is coupled between the signal input and the signal output. The switchable dynamic biasing stage has an input coupled to the signal input. The switchable gain boosting stage has an input coupled to the signal input. The switching device is coupled to the amplifier stage such that either an output of the switchable dynamic biasing stage or an output of the switchable gain boosting stage are coupled to the amplifier stage.

The signal to be amplified is supplied to the amplifier stage either via the switchable dynamic biasing stage or via the switchable gain boosting stage. The amplifier stage amplifies the signal and the amplified signal is provided at the signal output.

The otherwise contradictory concepts of dynamic biasing and gain boosting are combined using the switching device. With this embodiment of an amplifier arrangement, power efficient and high gain amplification can be achieved in a single stage. It is known in switched-capacitor and other clocked circuits that the amplifier experiences larger signal transients at the beginning of each amplification phase which are followed by small signal transients in the later part of the amplification phase. It is this knowledge which allows an optimal combination of dynamic biasing and gain boosting In one embodiment, the switching device is used to reconfigure the amplifier structure.

In another exemplary embodiment, the switching device is configured to realize a first mode of operation and a second mode of operation. In the first mode of operation, the output of the switchable dynamic biasing stage is coupled to the amplifier stage and the output of the switchable gain boosting stage is disconnected from the amplifier stage. In the second mode of operation, the output of the switchable gain boosting stage is coupled to the amplifier stage and the output of the switchable dynamic biasing stage is disconnected from the amplifier stage.

In the first mode of operation, which represents an initial large transient of the signal to be amplified, the dynamic biasing stage is active. The amplifier stage is dynamically biased which minimizes power consumption. In the second mode of operation, which represents the small signal phase where the amplifier stage settles to the desired high accuracy, the switchable gain boosting stage becomes active and the dynamic biasing stage is disconnected. This results in a superior gain. Consequently, the concept of dynamic biasing and the concept of gain boosting are applied in a time interleaved manner. The amplifier arrangement is reconfigured in response to the signal to be amplified to optimize the competing performance parameters superior gain and minimal power consumption. This advantage is prominent especially in clocked circuits where the already existing clock can be reused to control the switching device. In other words, by enabling the switchable dynamic biasing stage in the initial large signal phase of amplification and the switchable gain boosting stage in a latter small signal phase of amplification by means of the switching device, high gain and low current consumption are simultaneously realised.

In one embodiment, two different structures of the amplifier arrangement are multiplexed in time to optimize different parameters simultaneously. In this application power consumption and gain are optimized for instance.

In several embodiments, the amplifier arrangement is configured to be operated with differential signals. That means, that the signal to be amplified and the amplified signal can be in the form of differential signals which comprise a first and a second component which have a signal level complementary with respect to a reference level.

In another exemplary embodiment an input stage is coupled between the signal input and the amplifier stage to convert an input voltage to a current.

In another exemplary embodiment the input stage comprises an operational transconductance amplifier.

In another exemplary embodiment a coupling unit is coupled between the input stage and the amplifier stage.

In another exemplary embodiment the coupling unit comprises at least two transistors.

In another exemplary embodiment the amplifier stage comprises at least two transistors.

In another exemplary embodiment the gain boosting stage comprises at least two operational amplifiers, each dedicated to a control input of one transistor of the amplifier stage.

In one exemplary embodiment of a method for signal amplification, a signal to be amplified is supplied. In a first mode of operation, the signal is amplified using dynamic biasing. In a second mode of operation, the signal is amplified using gain boosting. Furthermore, an amplified signal is provided.

In the first mode of operation, which represents an initial large transient of the signal to be amplified, dynamic biasing is applied to the signal amplification process. In the second mode of operation, which represents a small signal phase where the amplified signal settles, gain boosting is used in the amplification process. Thereby, the advantages of dynamic biasing, namely reduced current consumption, and the advantage of gain boosting, namely a high gain are combined. This is achieved by time interleaving the two competing concepts.

In another exemplary embodiment of the method for signal amplification the signal to be amplified and the amplified signal are in a differential form.

BRIEF DESCRIPTION OF THE DRAWINGS

The text below explains the invention in detail using exemplary embodiments with reference to the drawings, in which.

DETAILED DESCRIPTION OF THE DRAWINGS

Figure 1:
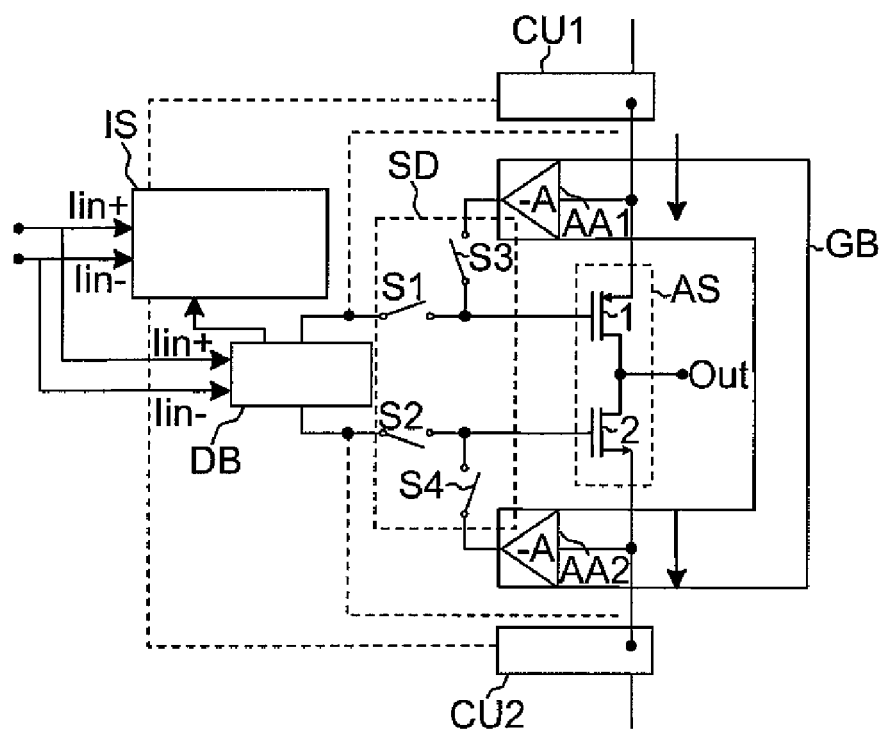
FIG. 1 shows a first exemplary embodiment of an amplifier arrangement.

FIG. 1 shows a first exemplary embodiment of an amplifier arrangement comprising an amplifier stage AS, a gain boosting stage GB, a dynamic biasing stage DB, a switching device SD, a coupling unit comprising two parts CU1 and CU2, an input stage IS, a signal input with two input terminals Iin+ and Iin−, and a signal output Out. The amplifier stage AS comprises two transistors 1, 2. Transistor 1 can comprise a p-channel field effect transistor. Transistor 2 can comprise an n-channel field effect transistor. A drain terminal of transistor 1 is coupled to a drain terminal of transistor 2. This connection forms the signal output Out. A gate terminal of transistor 1 and gate terminal of transistor 2 are coupled to the switching device SD. A source terminal of transistor 1 and a source terminal of transistor 2 are coupled to the gain boosting stage GB.

The gain boosting stage GB comprises two auxiliary amplifiers AA1 and AA2. Each auxiliary amplifier AA1 and AA2 can comprise an operational transconductance amplifier. An input of the auxiliary amplifier AA1 is coupled to the source terminal of transistor 1 of the amplifier stage AS. An output of the auxiliary amplifier AA1 is coupled to the switching device SD. An input of the auxiliary amplifier AA2 is coupled to the source terminal of transistor 2 of the amplifier stage AS. An output of the auxiliary amplifier AA2 is coupled to the switching device SD.

The dynamic biasing stage DB comprises two inputs which are coupled to the input terminal Iin+ and to the input terminal Iin− respectively. Furthermore, the dynamic biasing stage DB comprises two outputs which are coupled to the switching device SD.

The switching device SD comprises four switches S1, S2, S3, and S4. Switches S1 and S2 are coupled on the one side to the outputs of the dynamic biasing stage DB. On the opposite side, switches S1 and S2 are coupled to the gate terminals of transistor 1 and 2 of the amplifier stage AS. On the one side, switches S3 and S4 are connected to the outputs of the auxiliary amplifiers AA1 and AA2 respectively. On the opposite side, switches S3 and S4 are coupled to the gate terminals of transistor 1 and 2, respectively. The switching device SD is configured such that switches S1 and S2 are closed when switches S3 and S4 are open. This represents a first mode of operation. In a second mode of operation, the switching device SD is configured such that switches S3 and S4 are closed when switches S1 and S2 are open. Consequently, in the first mode of operation, the outputs of the dynamic biasing stage DB are coupled to the amplifying stage AS and in the second mode of operation, the outputs of the gain boosting stage GB are coupled to the amplifying stage AS.

The input stage IS comprises two inputs which are coupled to the input terminals Iin+ and Iin− respectively. The input stage IS can comprise a transconductance amplifier. A first output of the input stage IS is coupled to the source terminal of transistor 1 of the amplifier stage AS via the first part CU1 of the coupling unit. A second output of the input stage IS is coupled to the source terminal of transistor 2 of the amplifier stage AS via the second part CU2 of the coupling unit. The first and second part CU1 and CU2 of the coupling unit can each comprise one field effect transistor.

One application for the present invention is in switched capacitor circuits. Differential signals in such circuits always comprise an initial large transient followed by a small signal phase. When a differential signal is supplied to the input terminals Iin+ and Iin−, the amplifier arrangement enters the first mode of operation. This means that switches S1 and S2 are closed and switches S3 and S4 are open so that the dynamic biasing stage DB is coupled to the amplifying stage AS. Transistors 1 and 2 of the amplifier stage AS are biased in a way that a current applied to them is increased when needed. In the second mode of operation, switches S1 and S2 are open while switches S3 and S4 are closed. Consequently, the dynamic biasing stage DB is disconnected from the amplifier stage AS and instead the gain boosting stage GB is coupled to the amplifier stage AS. This results in the achievement of a superior gain of the amplified signal provided at the signal output Out.

In other words, the control of the amplifier stage AS is time multiplexed between the first mode of operation where the dynamic biasing stage DB is active and the second mode of operation where the gain boosting stage GB is active. Thereby, a power efficient high gain amplifier is realized in a single stage. The switching between the first mode and second mode can be implemented by using the clock of a switched capacitor circuit in which the amplifier arrangement is used.

Figure 2:
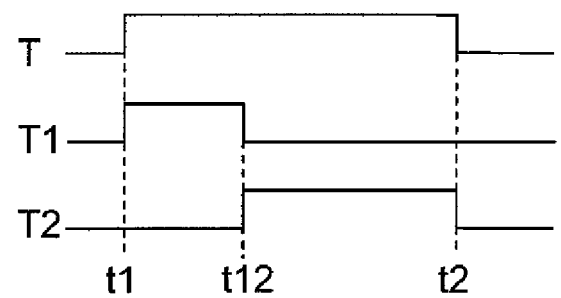
FIG. 2 shows exemplary timing diagrams.

FIG. 2 shows exemplary timing diagrams. In the uppermost diagram, a total phase T of an amplifier stage AS operation is depicted. The amplifier stage AS starts operating at a point in time t1 and ceases operating at a point in time t2. The diagram in the middle shows the timing for the first mode of operation T1 which starts at the time t1 and lasts until a point in time t12. During the first mode of operation T1, the differential input signal is going through a large transient during which dynamic biasing is applied. The diagram at the bottom shows the timing for the second mode of operation T2 which lasts from the time t12 until the time t2. This represents a small signal phase where the amplifier stage settles to the desired high accuracy. In the second mode of operation T2, gain boosting becomes effective.

In summary, the diagrams show the time multiplexing between the first mode of operation T1 and the second mode of operation T2, namely between a dynamic biasing phase and a gain boosting phase. Only by applying time multiplexing the concepts of gain boosting and dynamic biasing can be combined in an amplifier achieving a superior gain with minimal power consumption.

Figure 3:
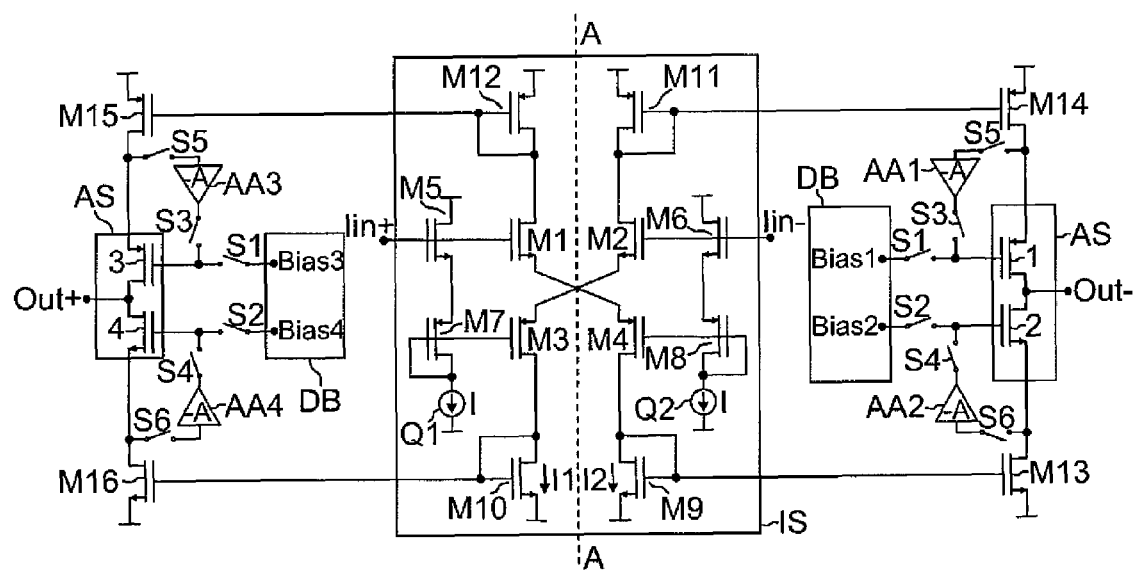
FIG. 3 shows a second exemplary embodiment of an amplifier arrangement.

FIG. 3 shows a second exemplary embodiment of an amplifier arrangement comprising all functional blocks of FIG. 1 amended for operation with differential signals and with an exemplary embodiment of the input stage IS. The amplifier arrangement comprises an input with the two input terminals Iin+ and Iin−, as well as an output with two output terminals Out+ and Out−. The circuit depicted is configured to be operated with differential signals, which means that a differential input signal is supplied to the input terminals Iin+ and Iin− and that a differential output signal is provided at the output terminals Out+ and Out−. Therefore, the schematic is symmetric about the axis A-A. The input stage IS comprises 12 transistors M1, M2, M3, M4, M5, M6, M7, M8, M9, M10, M11, and M12. Gate terminals of transistors M1 and M5 are coupled to the input terminal Iin+. Gate terminals of transistors M2 and M6 are coupled to the input terminal Iin−. Transistors M1, M2, M5 and M6 are realized for example as identical n-channel Metal Oxide Semiconductor, NMOS, transistors. Transistors M3, M4, M7 and M8 are designed for example as identical p-channel Metal Oxide Semiconductor, PMOS, transistors. A source terminal of transistor M5 is coupled to a source terminal of transistor M7. A gate and a drain terminal of transistor M7, as well as a gate terminal of transistor M3 are coupled to a current source Q1. A source terminal of transistor M6 is coupled to a source terminal of transistor M7. A gate and a drain terminal of transistor M8, as well as a gate terminal of transistor M4 are coupled to a current source Q2. A source terminal of transistor M1 is connected to a source terminal of transistor M4, a source terminal of transistor AA2 is coupled to a source terminal of transistor M3. A drain terminal of transistor M1 is connected to a drain and a gate terminal of transistor M12. A drain terminal of transistor M2 is connected to a drain and a gate terminal of transistor M11. A drain terminal of transistor M3 is connected to a drain terminal and a gate terminal of transistor M10. A drain terminal of transistor M4 is coupled to a drain and a gate terminal of transistor M9. A first input branch is formed by transistors M1, M3, M5, M7, M10, and M12. A second input branch is built by transistors M2, M4, M6, M8, M9, and M11. The two current sources Q1 and Q2 are matched, producing the same current I and defining the circuit's quiescent current level. It follows, that in the quiescent state of the circuit when no signal is applied to the input terminals Iin+ and Iin−, a current I1 flowing through the first input branch corresponds to the value of the current I provided by the current source Q1. For symmetry reasons, the same is true for the second input branch. In the quiescent state, a current I2 flowing through the second input branch also equals the current I.

The dynamic biasing stage DB from FIG. 1 is represented here by four biased terminals Bias1, Bias2, Bias3, and Bias4. The dynamic biasing stage DB uses copies of the currents I1 and I2 to produce dynamically biased voltages applied to the terminals Bias1, Bias2, Bias3, and Bias4. These voltages vary as a function of time and signal level.

The coupling unit here comprises four transistors M13, M14, M15, and M16. Transistors M14 and M15 are designed for example as PMOS devices, whereas transistors M13 and M16 are designed for example as NMOS devices. A gate terminal of transistor M14 is connected to the gate and the drain terminals of transistor M11 thereby forming a current mirror with the gain one for the current I2. A drain terminal of transistor M14 is connected to a source terminal of transistor 1 of the amplifier stage AS, as well as to an input of the auxiliary amplifier AA1 via a switch S5. A gate terminal of transistor M13 is connected to the gate and the drain terminals of transistor M9, thereby forming a current mirror. A drain terminal of transistor M13 is connected to a source terminal of transistor 2 of the amplifier stage AS, as well as to an input of the auxiliary amplifier AA2 via a switch S6. A gate terminal of transistor M15 is connected to the gate and the drain terminals of transistor M12, thereby building a current mirror. A drain terminal of transistor M15 is connected to a source terminal of transistor 3 of the amplifier stage AS, as well as to an input of an auxiliary amplifier AA3 via switch S5. A gate terminal of transistor M16 is connected to the gate and the drain terminal of transistor M10, thereby forming a current mirror. The drain terminal of transistor M16 is connected to a source terminal of transistor 4 of the amplifier stage AS, as well as to an input of an auxiliary amplifier AA4 via switch S6. Furthermore, transistors M14, M15, M16, and M17 compose cascodes to transistors 1, 2, 3, and 4 of the amplifier stage AS, respectively. Switches S5 and S6 are used for further insulation of the auxiliary amplifiers AA1, AA2, AA3, and AA4.

Because of the use of differential input and output signals, the amplifier stage AS comprises the four transistors 1, 2, 3, and 4. The connection between drain terminal of transistor 1 and drain terminal of transistor 2 constitutes the output terminal Out−. The connection between a drain terminal of transistor 3 and a drain terminal of transistor 4 constitutes the output terminal Out+.

For the same reason, the gain boosting stage GB in this embodiment comprises four auxiliary amplifiers AA1, AA2, AA3 and AA4. Accordingly, two output branches are formed. A first output branch comprises the output terminal Out+, transistors M15 and M16, transistors 3 and 4 of the amplifier stage AS, the biased terminals Bias3 and Bias4 of the dynamic biasing stage DB, and the switches S1, S2, S3, S4, S5, and S6 of the switching device SD. A second output branch is built symmetrically to the first output branch by the transistors M13 and M14, by the biased terminals Bias1 and Bias2, by the switches S1, S2, S3, S4, S5, and S6, by the output terminal Out−, by the transistors 1 and 2 and by the auxiliary amplifiers AA1 and AA2.

In this embodiment, the switching device SD comprises switches S1, S2, S3, S4, S5, and S6. The switching device SD is configured such that switches S1 and S2 are closed when switches S3, S4, S5, and S6 are open. This corresponds to the first mode of operation. During the second mode of operation, switches S1 and S2 are open when switches S3, S4, S5, and S6 are closed.

When no signal is applied which means the circuit is in a quiescent state, the current I is flowing through the first and the second input branch and is mirrored to the first and the second output branch. If a large positive differential input signal is supplied, the current I1 flowing through the first input branch practically equals zero. Current I2 flowing through the second input branch increases to a peak value. The current I2 is mirrored to the output terminals Out+ and Out−. In the first mode of operation, the amplifier stage AS on the first and on the second output branch is dynamically biased. In the second mode of operation, the amplifier stage AS on the first and on the second output branch is gain boosted using the auxiliary amplifiers AA1, AA2, AA3, and AA4.

As the scheme does not employ any positive feedback for gain enhancement, it is inherently more stable and robust while providing much larger gain. This results in a superior gain and transient performance with minimal power consumption.

In another exemplary embodiment of the amplifier arrangement the functions of dynamic biasing and gain boosting are realized through the use of the same physical devices which can be rearranged with the help of switches. This leads to a further reduction in power consumption.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. An amplifier arrangement comprising:
   a signal input to receive a signal to be amplified;
   a signal output to provide an amplified signal;
   an amplifier stage coupled between the signal input and the signal output;
   a switchable dynamic biasing stage with an input coupled to the signal input;
   a switchable gain boosting stage with an input coupled to the signal input; and
   a switching device coupled to the amplifier stage such that either an output of the switchable dynamic biasing stage or an output of the switchable gain boosting stage are coupled to the amplifier stage.

2. The amplifier arrangement according to claim 1, wherein the switching device is configured such that, in a first mode of operation, the output of the switchable dynamic biasing stage is coupled to the amplifier stage and the output of the switchable gain boosting stage is disconnected from the amplifier stage and that, in a second mode of operation, the output of the switchable gain boosting stage is coupled to the amplifier stage and the output of the switchable dynamic biasing stage is disconnected from the amplifier stage.

3. The amplifier arrangement according to claim 1, which is configured to be operated with differential signals.

4. The amplifier arrangement according to claim 3, wherein an input stage is coupled between the signal input and the amplifier stage to convert an input voltage to a current.

5. The amplifier arrangement according to claim 4, wherein the input stage comprises an operational transconductance amplifier.

6. The amplifier arrangement according to claim 4, wherein a coupling unit is coupled between the input stage and the amplifier stage.

7. The amplifier arrangement according to claim 6, wherein the coupling unit comprises at least two transistors.

8. The amplifier arrangement according to claim 3, wherein the amplifier stage comprises at least two transistors.

9. The amplifier arrangement according to claim 8, wherein the switchable gain boosting stage comprises at least two operational amplifiers, each dedicated to a control input of one transistor of the amplifier stage.

10. A method for signal amplification, comprising the steps of:
    supplying a signal to be amplified;
    in a first mode of operation, amplifying the signal using dynamic biasing;
    in a second mode of operation, amplifying the signal using gain boosting; and
    providing an amplified signal.

11. The method for signal amplification according to claim 10, wherein the signal to be amplified and the amplified signal are in a differential form.

* * * * *